United States Patent
Tsukamoto et al.

(10) Patent No.: US 7,282,742 B2
(45) Date of Patent: Oct. 16, 2007

(54) ORGANIC SEMICONDUCTOR MATERIAL AND ORGANIC SEMICONDUCTOR ELEMENT EMPLOYING THE SAME INCLUDING CARBON NANOTUBES

(75) Inventors: Jun Tsukamoto, Shiga (JP); Junji Mata, Shiga (JP)

(73) Assignee: Toray Industries, Inc., Tokyo (JP)

( * ) Notice: Subject to any disclaimer, the term of this patent is extended or adjusted under 35 U.S.C. 154(b) by 307 days.

(21) Appl. No.: 10/491,084

(22) PCT Filed: Sep. 25, 2002

(86) PCT No.: PCT/JP02/09851

§ 371 (c)(1),
(2), (4) Date: Mar. 26, 2004

(87) PCT Pub. No.: WO03/029354

PCT Pub. Date: Apr. 10, 2003

(65) Prior Publication Data

US 2004/0241900 A1    Dec. 2, 2004

(30) Foreign Application Priority Data

Sep. 27, 2001    (JP)    ............................. 2001-295899

(51) Int. Cl.
*H01L 33/00*    (2006.01)
(52) U.S. Cl. .................. 257/88; 257/E51.023; 977/932
(58) Field of Classification Search ............... 257/88, 257/E51.023; 977/932
See application file for complete search history.

(56) References Cited

U.S. PATENT DOCUMENTS 6,525,453 B2 *    2/2003    Cheng et al. ............... 313/309
6,576,341 B1    6/2003    Davey et al. ............... 428/370

FOREIGN PATENT DOCUMENTS

| JP | 07-102197 | 4/1995 |
| JP | 2000-44216 | 2/2000 |
| JP | 2000-063726 | 2/2000 |

OTHER PUBLICATIONS

Woo, H.S., et al., "Organic Light Emitting Diodes Fabricated with Single Wall Carbon Nanotubes Dispersed in a Hole Conducting Buffer: the Role of Carbon Nanotubes in a Hole Conducting Polymer", Synthetic Materials, 116 (Jan. 15, 2001), pp. 369-372.*
Bley et al., "Thermoset and Thermoplastic Composites Using Polymer Wrapped SWNTs as Reinforcement", Reviews on Advanced Materials Science, 2003 vol. 5, No. 4, pp. 354-362.*

(Continued)

*Primary Examiner*—William M. Brewster
(74) *Attorney, Agent, or Firm*—Morrison & Foerster, LLP (57) ABSTRACT

The present invention relates to an organic semiconductor material in which carbon nanotubes are dispersed in a conjugated polymer, and the weight fraction of the carbon nanotubes is 3 percent or less relative to the conjugated polymer. According to the present invention, an organic semiconductor material having a high carrier mobility can be supplied industrially. Furthermore, high-performance organic semiconductor devices, e.g., organic thin film transistor devices and organic photovoltaic devices, can be provided.

8 Claims, 4 Drawing Sheets

OTHER PUBLICATIONS

Applied Physics Letters, "Single-wall carbon nanotube/conjugated polymer photovoltaic devices" vol. 80, No. 1, p. 112-114.
Synthetic Metals, "Electrical and optical properties of conducting polymer-C60 carbon nanotube system," 121 (2001), p. 1591-1592.
Advanced Materials, 1998, 11, No. 15, p. 1281-1285.
Advanced Materials, 1998, 10, No. 14, p. 1091-1093.
Applied Physics Letters, "Soluble and Processable regioregular poly(3-hexylthiophene) for thin film field-effect transistor applications with high mobility," 69, (26), p. 4108-4110.
American Physical Society, "Percolation-dominated conductivity in a conjugated-polmer-carbon nanotube composite," Physical Review B, vol. 58, No. 12, p. 7492-7495.
Supplementary European Search Report, Oct. 4, 2004, EPO.
*Polymers and Polymerisation*, Rapra Abstracts, Dec. 2000, p. 67.
*Synthesis and Properties of Carbon Nanotube-Polypyrrole Composites*, Synthetic Metals 102(1999), pp. 1266-1267.

* cited by examiner

ORGANIC SEMICONDUCTOR MATERIAL AND ORGANIC SEMICONDUCTOR ELEMENT EMPLOYING THE SAME INCLUDING CARBON NANOTUBES

TECHNICAL FIELD

The present invention relates to an organic semiconductor material comprising a conjugated polymer and carbon nanotubes, and to an organic semiconductor device including the organic semiconductor material as a semiconductor.

BACKGROUND ART

Conjugated polymers have semiconductor characteristics and, therefore, are noted as semiconductor materials in place of known silicon and compound semiconductors. If such a polymer can be used as a semiconductor material, significant cost reduction can be expected because of inexpensiveness of a material and simplicity of a device manufacturing process compared with those of inorganic semiconductors, e.g., crystalline silicon and amorphous silicon, now in use. Furthermore, high-temperature processes become unnecessary and devices can be prepared by the use of coating technologies and printing technologies. Therefore, devices can also be provided on organic films, and driving devices of flexible displays and semiconductor devices of wearable computers are realized.

Inorganic semiconductors, e.g., crystalline silicon and amorphous silicon, are used for photovoltaic devices now. However, the costs of solar cells prepared by the use of these inorganic semiconductors are higher than those of power-generation types, e.g., thermal power generation and nuclear power generation, and solar cells have not yet come into adequately widespread use. A primary factor responsible for the high cost is the process in which semiconductor thin films are manufactured in a vacuum at a high temperature. Consequently, development of an inexpensive manufacturing method allows significant cost reduction and, thereby, fast expansion of the solar cell market can be expected.

With respect to semiconductor materials, in general, carriers (electrons or holes) included in the materials are required to have high mobilities. However, conjugated polymers have a problem in that the mobilities are lower than those of inorganic crystalline semiconductors or amorphous silicon. Consequently, semiconductor devices, e.g., Field Effect Transistors (hereafter referred to as FETs) and photovoltaic devices, including conjugated polymers have a problem in that response times and output currents are inadequate. Therefore, application areas of organic semiconductors are significantly limited now and, in general, inorganic compounds, e.g., crystalline silicon, gallium arsenide, and amorphous silicon, are used under the present circumstances.

With respect to a FET device, it is preferable that larger current flows between a source electrode and a drain electrode. The current becomes larger as the mobility becomes higher. For example, the current Is in the region at which a current flowing between a source electrode and a drain electrode becomes saturated relative to a gate voltage (hereafter referred to as a saturation current) is represented by the following equation.

$$Is = (\mu CW/2D)(Vg-Vth)^2 \quad (1)$$

Here, $\mu$ represents a mobility, C represents a capacitance of an insulating material on the gate electrode, D and W represent a distance between the source electrode and the drain electrode and an electrode width, respectively. Vg represents a gate voltage, and Vth represents a gate voltage at which a saturation current begins to flow. As is clear from the equation (1), the saturation current of the FET increases as the mobility $\mu$ of the semiconductor material becomes higher.

The maximum operating frequency fm of the FET is roughly represented by the following equation, and driving can be carried out at a higher frequency as the mobility becomes higher.

$$fm = \mu V/2\pi D^2 \quad (2)$$

Here, $\mu$ represents a mobility, V represents a voltage between the source electrode and the drain electrode, and D represents a distance between the source electrode and the drain electrode.

On the other hand, with respect to the organic photovoltaic device including a conjugated polymer, the largest problem is that the photoelectric conversion efficiency is lower than those of known inorganic semiconductors and, therefore, commercialization is not yet realized. The primary reasons for this are the facts that traps which capture carriers tend to be formed in organic semiconductors and, thereby, formed carriers tend to be captured by traps and the mobilities of the carriers are decreased, and that a bound state referred to as an exciton is formed, in which an electron and a hole formed by incident light are not readily separated from each other.

It is an object of the present invention to provide a method for increasing the mobilities of carriers in an organic semiconductor material constituting a semiconductor device, e.g., a transistors and a photovoltaic device, an organic semiconductor material prepared by the method, and an organic semiconductor device prepared by the use of the material.

DISCLOSURE OF INVENTION

In order to achieve the above-described object, the present invention has the following configurations.

An organic semiconductor material, in which carbon nanotubes are dispersed in a conjugated polymer and the weight fraction of the carbon nanotubes is 3 percent or less relative to the conjugated polymer.

An organic thin film transistor device including an organic semiconductor material layer in which carbon nanotubes are dispersed in a conjugated polymer.

An organic photovoltaic device having a structure in which an organic semiconductor material layer is sandwiched between a first electrode having a light transmission property and a second electrode, and carbon nanotubes are dispersed in a conjugated polymer in the organic semiconductor material layer.

A method for increasing the mobility of a conjugated polymer, wherein the method includes the step of dispersing carbon nanotubes in the conjugated polymer.

BEST MODE FOR CARRYING OUT THE INVENTION

The inventors of the present invention conducted intensive research on creation of organic semiconductor materials having high mobilities and, as a result, the present invention has been made. That is, the inventors of the present invention found out that an organic semiconductor material having a high mobility was able to be prepared by dispersing a very small amount of carbon nanotubes (hereafter referred to as CNTs) in a conjugated polymer, and that a high-performance organic semiconductor device was able to be prepared by the use of the above-described organic semiconductor material.

The method in which the electrical conductivity of a polymer material is improved by dispersing CNTs in the polymer medium is disclosed in, for example, Japanese Unexamined Patent Application Publication No. 7-102197, Japanese Unexamined Patent Application Publication No. 2000-63726, and the like. In these methods, CNTs are brought into contact with each other in a polymer so as to form paths for flowing the electricity and, thereby, electrical conductivity is imparted to the polymer. Since CNTs are good conductors, electrical conductivity is improved by these methods. However, the semiconductor characteristics are not improved and, therefore, the object of the present invention is not achieved.

On the other hand, in the present invention, since a very small amount of CNTs are blended, almost no conductive path is formed by the CNTs being contacted with each other. In a polymer having semiconductor characteristics, carriers are trapped at interfaces between crystallites and the like or in amorphous regions and, thereby, the mobility is reduced. The inventors of the present invention found out that when a very small amount of CNTs were dispersed, the CNTs having a high mobility carried out cross-linking of the above-described regions, reduced trapping, and increased the mobility of carriers. In the present invention, the conjugated polymer having the semiconductor characteristics is inevitably used as a medium. Since it is not intended to improve the electrical conductivity through the use of the conductive paths formed by the CNTs being contacted with each other, the amount of dispersion of CNTs must be controlled at a low level.

The present invention will be described below in detail.

1. Carbon Nanotube

A carbon nanotube is prepared by an arc discharge method, a chemical vapor deposition method (CVD method), a laser abrasion method, and the like, and every method may be used in the present invention. The carbon nanotube includes a single-walled carbon nanotube (SWLNT) in which one carbon film (graphene sheet) is rolled up in the shape of a cylindrical tube and a multi-walled carbon nanotube (MWCNT) in which plural, at least two graphene sheets are concentrically rolled up, and either the SWCNT or the MWCNT may be used in the present invention. Among them, the SWCNT has a surface area larger than that of the MWCNT even when the volume density is the same and, therefore, the mobility is readily increased.

When SWCNTs or MWCNTs are prepared by the above-described method, fullerene, graphite, amorphous carbon, and the like are simultaneously generated as carbon material byproducts and, furthermore, metal catalysts, e.g., nickel, iron, cobalt, and yttrium, remain as well. These impurities must be eliminated. In particular, carbon material byproducts, e.g., fullerene, adversely affect the semiconductor characteristics. Preferably, the amount of carbon material byproducts contained in a conjugated polymer is 0.03 percent by weight or less, and more preferably is 0.01 percent by weight or less.

In the present invention, short CNTs are preferably used in order to prevent a short circuit between the electrodes sandwiching the organic semiconductor material layer. Preferably, the average length of CNTs used in the present invention is 2 µm or less, and more preferably is 0.5 µm or less. In general, since CNTs are formed in the shape of a cord, desirably, CNTs are cut into short fibers. An acid treatment with nitric acid, sulfuric acid, or the like, as well as an ultrasonic treatment, is effective at eliminating impurities and cutting into short fibers. More preferably, the separation with a filter is simultaneously carried out in order to improve the purity.

In the present invention, not only the cut CNTs, but also CNTs prepared beforehand in the shape of short fibers are used preferably. For example, the above-described short-fiber-shaped CNTs are prepared, while being in the shape oriented in the direction perpendicular to a substrate surface, by forming a catalyst metal, e.g., iron or cobalt, on the substrate, followed by a CVD method, in which a carbon compound is thermally decomposed at 700° C. to 900° C., to prepare vapor-grown CNTs on the surface thereof. The thus prepared short-fiber-shaped CNTs are taken out by being peeled off the substrate or by other methods. Alternatively, short-fiber-shaped CNTs are prepared by allowing a catalyst metal to be carried on a porous support, e.g., porous silicon, an alumina anodized film, a zeolite compound, or the like, followed by growing CNTs on the surface thereof through a CVD method. Oriented short-fiber-shaped CNTs may also be prepared by a method, in which CNTs are prepared on a substrate by carrying out CVD in a gas stream of argon/hydrogen through the use of molecules, such as iron phthalocyanine, containing a catalyst metal in a molecule as a raw material. Furthermore, oriented short-fiber-shaped CNTs may also be prepared on a SiC single crystal surface by an epitaxial growth method.

The diameters of CNTs used in the present invention are not specifically limited. Preferably, the diameter is at least 1 nm and 100 nm or less, and more preferably is 50 nm or less.

2. Conjugated Polymer

In the present invention, a conjugated polymer is used as the polymer constituting a composite together with CNTs. The conjugated polymer refers to a polymer in which single bonds and double bonds are alternately linked with respect to carbon-carbon bonds in the polymer skeleton. Conjugated polymers include helical conjugated polymers having a helical structure in a stable state (in a state in which no external force is applied), straight chain conjugated polymers which do not have any helical structure in a stable state and which extend in a straight line, and the like. Every these polymer may be used in the present invention. With respect to the helical conjugated polymers, conjugated chains may be interrupted in a molecular chain, and overlap between π-electrons is reduced due to the helical structure. Consequently, straight chain conjugated polymers are preferable in order to increase the mobility. Among them, in particular, solvent-soluble straight chain conjugated polymers are used preferably.

Examples of conjugated polymers having a helical structure include polyphenylenevinylene (hereafter referred to as PPV)-based polymers, polythienylenevinylene (hereafter referred to as PTV)-based polymers, and polyphenylacetylenes. In particular, PPV-based polymers and PTV-based polymers are preferable.

PPV-based polymers and PTV-based polymers may be prepared through a synthesizing method, e.g., a Wittig reaction method, a dehydrohalogenation method, and a sulfonium salt decomposition method. In every method, the starting raw material is xylylene dihalide, polymerization is carried out by a condensation reaction, unnecessary substituents are eliminated and, thereby, a polymer is prepared. On the other hand, with respect to arrangement in the main chain, a position of the substituent of phenylene may be selected from p-position, m-position, and o-position. The type of the starting raw material, xylylene halide, is changed to p-xylylene dihalide, m-xylylene dihalide, or o-xylylene dihalide in accordance with the purpose and, thereby, the position of the substituent is controlled at a desired position.

PPV-based polymers having a helical structure may be prepared by alternating copolymerization of p-PPV and m-PPV. For example, in the synthesis of a PPV alternating copolymer, m-xylylene dichloride having a vinylene group at m-position is used as the starting raw material. The structure of the vinylene group includes a cis form and a trans form, and the ratio of the generation of the cis form to the trans form varies depending on synthesizing methods. Therefore, an optimum synthesizing method must be selected to attain a desired structure. Preferably, synthesis is carried out by the use of the Wittig reaction method in order to attain a high proportion of trans form. An intermediate product, m-xylylene-bis-(triphenylphosphonium chloride), is synthesized from this raw material and, subsequently, the resulting intermediate product and terephthalaldehyde are dissolved in a solvent, so that a alternating copolymer composed of p-phenylenevinylene and m-phenylenevinylene is prepared.

Likewise, PTV-based polymers having a helical structure may be prepared by alternating copolymerization of p-PTV and m-PPV.

Polyphenylacetylene is synthesized by the use of a catalyst (tungsten hexachloride/tetraphenyltin) in a toluene solvent.

Examples of straight chain conjugated polymers include polythiophene-based polymers, polypyrrole-based polymers, polyaniline-based polymers, polyacetylene-based polymers, poly-p-phenylene-based polymers, poly-p-phenylenevinylene-based polymers, and polythienylenevinylene-based polymers.

Among the above-described polymers, polythiophene-based polymers, poly-p-phenylenevinylene-based polymers, and poly-p-thienylenevinylene-based polymers are preferably used in the present invention. In particular, polythiophene-based polymers are preferable. The polythiophene-based polymers refers to polymers having a poly-p-thiophene skeleton, and also include those having a structure with a side chain. Specific examples thereof include poly-3-alkylthiophenes, e.g., poly-3-methylthiophene, poly-3-butylthiophene, poly-3-hexylthiophene, poly-3-octylthiophene, and poly-3-decylthiophene; poly-3-alkoxythiophenes, e.g., poly-3-methoxythiophene, poly-3-ethoxythiophene, and poly-3-dodecyloxythiophene; and poly-3-alkoxy-4-alkylthiophenes, e.g., poly-3-methoxy-4-methylthiophene and poly-3-dodecyloxy-4-methylthiophene.

The poly-p-phenylenevinylene-based polymers refers to polymers having a poly-p-phenylenevinylene skeleton, and substituents may be added to phenylene rings and/or vinylene groups. In particular, polymers in which substituent are added to 2- and 5-positions of phenylene rings are used preferably. Examples thereof include poly(2-methoxy-5-dodecyloxy-p-phenylenevinylene), poly(2-methoxy-5-(3', 7'-dimethyloctyloxy)-p-phenylenevinylene), poly(2-methoxy-5-(2'-ethylhexoxy-p-phenylenevinylene), and poly(2,5-bisoctyloxy-p-phenylenevinylene).

The conjugated polymer in the present invention does not necessarily have a high molecular weight, and may be an oligomer.

3. Method for Manufacturing Organic Semiconductor Material

The above-described conjugated polymer and CNTs are mixed with an appropriate solvent so as to prepare an organic semiconductor material solution. Examples of preferable solvents to be used include methanol, toluene, xylene, and chloroform, which can dissolve the conjugated polymers or intermediates thereof.

In general, SWCNTs are coagulated in the shape of a bundle just after preparation. Preferably, the SWCNTs are released from this bundle state, and are dispersed in order to increase the mobility. In general, when CNTs are dispersed in a polymer, dispersibility is imparted to the CNTs through a chemical modification by, for example, a method in which functional groups are added to the CNTs. However, when the CNT is subjected to the chemical modification, the π-conjugated system constituting the CNT tends to be broken and, therefore, there is a problem in that the characteristics inherent in the CNT are deteriorated. On the other hand, in the present invention, since CNTs are dispersed by the use of the conjugated polymer, there is an advantage in that dispersion can be carried out with no specific chemical modification.

The above-described conjugated polymer in a state of solution disperses CNTs excellently and, in addition, has the effect of dispersing CNTs while releasing the CNTs coagulated in the shape of a bundle, particularly in the case of SWCNTs.

Application of ultrasonic wave to the solution is also effective at dispersing CNTs excellently. In particular, it is more preferable that ultrasonic wave is applied over several times. For example, CNTs are added to the solvent, and somewhat strong (about 250 W) ultrasonic wave is applied with an ultrasonic pulverizer for about 30 minutes. At this time, no conjugated polymer is blended, or a small amount (the same level of amount as that of CNTs) of conjugated polymer is blended. The conjugated polymer is not entirely blended at the start in order to reduce deterioration of the conjugated polymer due to the ultrasonic pulverizer. Subsequently, a predetermined amount of conjugated polymer is added to this CNT-dispersed solution, and somewhat weak (about 120 W) ultrasonic wave is further applied for about 30 minutes. The resulting CNT-dispersed solution is stood for about one day in a refrigerator and, thereafter, ultrasonic wave is applied again with an ultrasonic cleaner (about 120 W) for about 30 minutes. In this manner, an organic semiconductor material solution can be prepared, in which CNTs are very excellently dispersed.

The amount of CNTs used in the organic semiconductor material of the present invention is within the range of 3 percent or less on a weight fraction basis relative to the conjugated polymer. Preferably, the amount of CNTs is at least 0.01 percent on a weight fraction basis relative to the conjugated polymer, and more preferably is at least 0.1 percent. Further preferably, the weight fraction is at least 0.1 percent and 3 percent or less, and particularly preferably is at least 0.1 percent and 1 percent or less. Addition of CNTs within this range can significantly increase the mobility of the conjugated polymer. When carriers transfer between polymers or between domains, e.g., crystallites, since carriers are trapped and scattered due to irregularities in the structure between polymers or between domains, the mobility observed from the outside is significantly smaller than the mobility inherent in the polymer. In the present invention, the organic semiconductor material contains CNTs appropriately. Consequently, it is believed that CNTs having a high mobility act as bridges between polymers or between domains and, thereby, a high mobility can be attained.

However, if more than 3 percent of CNTs are blended, a proportion of CNTs in contact with each other is increased and, thereby, the electrical conductivity of the CNT-polymer composite is sharply increased and becomes close to that in a metal state. Consequently, the composite cannot be used as a semiconductor. On the other hand, if the weight fraction of CNTs is less than 0.01 percent, the effect of increasing the mobility is reduced.

In particular, when the composite is used as the organic semiconductor material for a photovoltaic device, preferably, CNTs are contained in the conjugated polymer at such a weight fraction that the ratio of photoluminescence intensity ($P_1/P_0$) of the maximum intensity $P_1$ in photoluminescence spectrum of the composite to the maximum intensity $P_0$ in photoluminescence spectrum of the above-described conjugated polymer containing no CNT becomes 0.5 or less, while photoluminescence is generated by the excitation light. Here, with respect to the measurement of the above-described ratio of photoluminescence intensity, the thicknesses of samples used for the measurement of $P_1$ and $P_0$ to be compared are controlled at the same constant thickness. A more preferable weight fraction allows the ratio of photoluminescence intensity ($P_1/P_0$) to become 0.2 or less. Further preferable weight fraction allows the ratio of photoluminescence intensity ($P_1/P_0$) to become 0.1 or less.

The above-described reduction of photoluminescence due to addition of CNTs is caused by the reduction in the rate at which electrons and holes generate excitons by the excitation light. That is, the reduction of photoluminescence indicates that dispersed CNTs efficiently separate electrons and holes generated by the excitation light, and indicates that an electromotive force is generated more effectively.

4. Measurement of Mobility

The mobility of the carrier in the organic semiconductor material is determined as described below. A metal layer (platinum, gold, and the like) serving as a first electrode is formed on a glass substrate by sputtering and, thereafter, an organic semiconductor material is applied to this metal layer surface by the use of a spinner. Subsequently, a metal thin film layer serving as a second electrode is formed on the resulting coating film surface by sputtering. A voltage V (volt) is applied between the first and second electrodes, and a current I (ampere) at that time is determined. As the voltage V is increased, a region of space-charge-limited current, in which the current I is proportional to the square of V, as represented by the following equation (3), comes following an ohmic behavior, in which the current I is proportional to V.

$$I = 9\epsilon\epsilon_0 \mu V^2 / 8d^3 \quad (3)$$

Here, $\epsilon_0$ represents a dielectric constant (farad/cm) of vacuum, $\epsilon$ represents a relative dielectric constant of an organic semiconductor material, $\mu$ represents a mobility (cm$^2$/(volt·sec)), and d represents a thickness (cm) of a coating film. The mobility $\mu$ is calculated based on the equation (3) in this region in which I is proportional to $V^2$. Alternatively, the mobility can also be determined from FET characteristics based on the equation (1) indicating a current characteristic of a FET.

In order to deliver outstanding performance as a semiconductor device, preferably, the mobility of the semiconductor material is at least $10^{-3}$ cm$^2$/(volt·sec). More preferably, the mobility is at least $10^{-2}$ cm$^2$/(volt·sec), and particularly preferably is at least $10^{-1}$ cm$^2$/(volt·sec).

5. Method for Manufacturing TFT

A method for manufacturing a thin film transistor including the above-described organic semiconductor material will be described with reference to a TFT. An n$^{++}$ silicon wafer is used as a gate electrode, and a SiO$_2$ film formed on the wafer is used as a dielectric layer. In order to form a source electrode and a drain electrode on the SiO$_2$ film, a thin layer of titanium is formed and, subsequently, a film of gold is formed by a sputtering method. The source electrode and the drain electrode are patterned by a lithography method. Alternatively, electrode patterns can also be directly formed by sputtering through the use of masks. In general, the distance between the source electrode and the drain electrode is 10 to 20 μm, the electrode width is in the order of 10 mm, although these may be changed depending on the required FET characteristics.

The organic semiconductor material solution prepared by the above-described method is applied to the above-described wafer, a thin film is formed by a spinner method and, thereafter, a heat treatment is carried out so as to form an organic semiconductor material layer on the electrodes. Subsequently, a lead wire is drawn out from each of the gate electrode, the source electrode, and the drain electrode so as to prepare a FET device. With respect to the evaluation of the FET characteristics, the voltage-current characteristic between the source and the drain is measured with, for example, Picoammeter/Voltage Source produced by Hewlett-Packard, while the gate voltage is varied.

6. Method for Measuring Photoluminescence Intensity

The organic semiconductor material solution prepared by the above-described method is applied to a glass substrate so as to form an organic semiconductor material layer having a uniform film thickness. The light absorption spectrum of this organic semiconductor material layer is measured with a spectrophotometer and, thereby, a wave range showing maximum absorption is determined. A fluorospectrophotometer is used, the above-described organic semiconductor material layer is excited at a constant wavelength within this wave range, and the intensity spectrum of the photoluminescence thereby emitted is measured.

7. Method for Manufacturing and Method for Evaluating Photovoltaic Device

The photovoltaic device of the present invention includes the first electrode having light transmission property on one surface of the above-described organic semiconductor material layer, and the second electrode on the other surface. The transmission property of the first electrode having light transmission property is not specifically limited as long as the transmission property is at such a level that the incident light passes through the electrode and enters the organic semiconductor material layer to generate an electromotive force. The thickness of the electrode thin film may be within the range in which the light transmission property and the electronic conductivity are exerted, and preferably is within the range of 20 nm to 300 nm although depending on the electrode material. The second electrode does not necessarily have transparency and, therefore, the thickness is not limited as well.

With respect to the electrode material, preferably, an electrically conductive material having a small work function is used for any one of the first electrode and the second electrode, and an electrically conductive material having a large work function is used for the other. Alkali metals and alkaline-earth metals, specifically lithium, magnesium, calcium, and the like are used as the electrically conductive material having a small work function. Likewise, tin and aluminum are used preferably. Furthermore, electrodes composed of alloys of the above-described metals or laminate of the above-described metals are also used preferably. Gold, platinum, chromium, nickel, indium-tin oxide, and the like are preferably used as the other electrically conductive material having a large work function.

If necessary, the photovoltaic device may be covered with a protective layer in order to improve the durability, e.g., moisture resistance and weather resistance, of the device.

A method for manufacturing the photovoltaic device including the above-described organic semiconductor material will be described. The second electrode is formed from indium oxide or gold on a glass substrate with a sputtering apparatus. The organic semiconductor material solution prepared by the above-described method is applied to this electrode with a spinner or the like so as to form an organic semiconductor material layer having a uniform film thickness. Preferably, the thickness of the organic semiconductor material layer is 1 µm to 50 nm. A metal aluminum thin film serving as the first electrode is formed on the organic semiconductor material layer by sputtering in order that light passes through the electrode as much as possible.

The thus prepared photovoltaic device is placed in a shield box, and the voltage-current characteristic is measured in a dark state while a voltage is applied. Subsequently, a light source for light irradiation disposed beforehand in the shield box is turned on, and the voltage-current characteristic (current characteristic in a bright state) is measured while the photovoltaic device is irradiated with the light.

The present invention will be described below in further detail with reference to examples. However, the present invention is not limited to the following examples.

EXAMPLE 1

SWCNTs (single-walled carbon nanotube: produced by Science Laboratories, purity 98 percent) were cut beforehand by a treatment in sulfuric acid/nitric acid, and 0.6 mg of the resulting SWCNTs were put in a 100 mL flask, 30 mL of chloroform and 0.6 mg of poly-3-hexylthiophene (produced by Aldrich, molecular weight: Mw 20,000, hereafter abbreviated as P3HT) were added, and an ultrasonic wave was applied with an ultrasonic pulverizer (250 W) for 30 minutes. The resulting dispersion was taken out by 1 mL, and 20 mg of P3HT was added thereto (ratio of CNTs to P3HT: 0.1 percent by weight), followed by ultrasonic irradiation with an ultrasonic pulverizer (120 W) for 30 minutes. The resulting dispersion was stood for one day in a refrigerator and, thereafter, ultrasonic wave was applied again with an ultrasonic cleaner (120 W) for 30 minutes, so as to prepare a transparent homogeneous solution.

Figure 2:
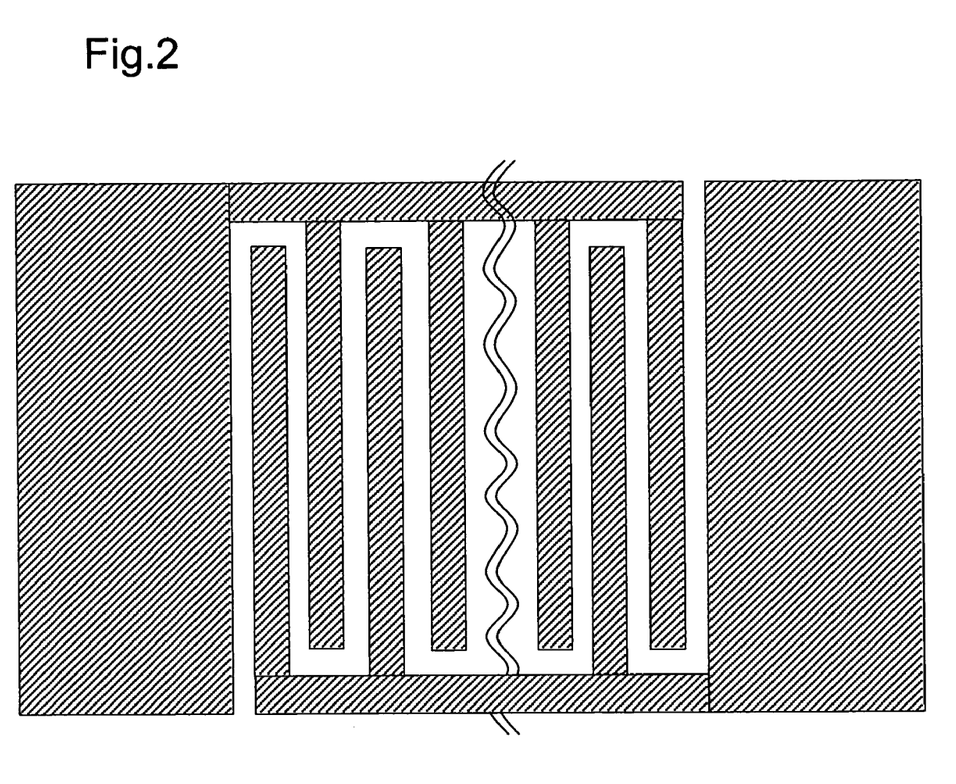
FIG. 2 is a schematic diagram showing interdigital electrodes.

The resulting organic semiconductor material solution (ratio of CNTs to polymer: 0.1 percent by weight) was taken out by 0.3 mL, and was applied to a glass substrate provided with opposite two interdigital electrodes (distance between electrodes: 10 µm) so as to prepare a coating film. Here, the interdigital electrodes refer to electrodes shown in FIG. 2. An accurate measurement can be carried out by disposing electrodes as described above. The voltage-current characteristic of the coating film was measured while a voltage was applied between the opposite two interdigital electrodes. The measurement result of the voltage-current characteristic was applied to the above-described equation (3), and the calculated mobility was $8 \times 10^{-3}$ cm$^2$/V·sec. The calculation was carried out on the assumption that the relative dielectric constant $\epsilon$ was 5.

On the other hand, the measurement was carried out as in the above description with respect to poly-3-hexylthiophene alone, which contains no CNT, and the mobility was $2 \times 10^{-4}$ cm$^2$/V·sec. From this result, it was shown that the mobility was increased in value by about 40 times because of dispersion of CNTs.

EXAMPLE 2

A PPV-based polymer, poly(m-phenylenevinylene-co-2, 5-dioctoxy-p-phenylenevinylene (hereafter abbreviated as PmPV), serving as a helical conjugated polymer was synthesized by the following method. A starting raw material, hydroquinone, was reacted with 2.1 equivalent weight of octylbromide in ethanol in the presence of an alkali, so as to prepare dioctoxybenzene. Bromomethylation was carried out by the reaction with 6 equivalent weight of paraformaldehyde in an acetic acid solution of 25% HBr, and cleaning was carried out with methanol, so as to prepare 2,5-dioctoxy-p-xylylene dibromide. Furthermore, a reaction with 2.2 equivalent weight of triphenylphosphine was carried out in N,N-dimethylformamide at 150° C., and the resulting white precipitate was washed three times with N,N-dimethylformamide and once with ethyl ether, followed by drying in a vacuum, so as to prepare an intermediate product, 2,5-dioctoxy-p-xylylene-bis-(triphenylphosphonium bromide). Subsequently, 104.4 g (Fw 1044, 0.1 mol) of this intermediate product and 14.7 g (Fw 134, 0.11 mol) of isophthalaldehyde were dissolved in 640 mL of ethanol, and a lithium ethoxide/ethanol solution (1.75 g of granular lithium was dissolved in 500 mL of ethanol) was dropped over 1 hour at room temperature, followed by being reacted for 4 hours, so as to prepare a yellow precipitate. The resulting yellow precipitate was washed twice with a mixed solvent of 40 mL of distilled water/100 mL of ethanol and once with 150 mL of ethanol, followed by drying in a vacuum at 60° C., so as to prepare 40.2 g (yield 87 percent) of yellow product. The resulting product was analyzed by the infrared spectroscopic analysis, and was identified as PmPV.

CNTs composed of multi-walled CNTs (MWCNTs) and single-walled CNTs (SWCNTs) were subjected to an acid treatment with nitric acid and sulfuric acid, and to an ultrasonic treatment with an ultrasonic cleaner for 20 hours. Consequently, impurities were eliminated and the CNTs were cut into short fibers. The PmPV synthesized by the above-described method was dissolved in a toluene solvent at a molarity of $10^{-3}$, and 1 percent of the above-described CNTs in the shape of short fibers were blended relative to the PmPV on a weight fraction basis, so as to prepare a transparent homogeneous organic semiconductor material solution.

An ultrasonic wave was applied to the resulting solution with an ultrasonic cleaner and, thereafter, the resulting solution was stood for about one day, so as to prepare a coating solution for spinner coating. The resulting coating solution was applied with a spinner to a glass substrate provided with an aluminum electrode (electrode 1) by vapor deposition in advance, so as to form a coating film of about 2 μm in thickness. Furthermore, an aluminum electrode (electrode 2) was formed on the resulting coating film by vapor deposition. The voltage-current characteristic is measured while a voltage is applied between the electrode 1 and the electrode 2, and the result is applied to the above-described equation (3) so as to determine the mobility.

When the calculation is carried out on the assumption that the relative dielectric constant of the organic semiconductor material $\epsilon=5$, the mobility of this organic semiconductor material is estimated to be about $3\times10^{-4}$ cm$^2$/V·sec.

On the other hand, the mobility of the coating film, which is simply composed of PmPV and contains no CNT, is estimated to be about $2\times10^{-7}$ cm$^2$/V·sec.

EXAMPLE 3

Figure 1:
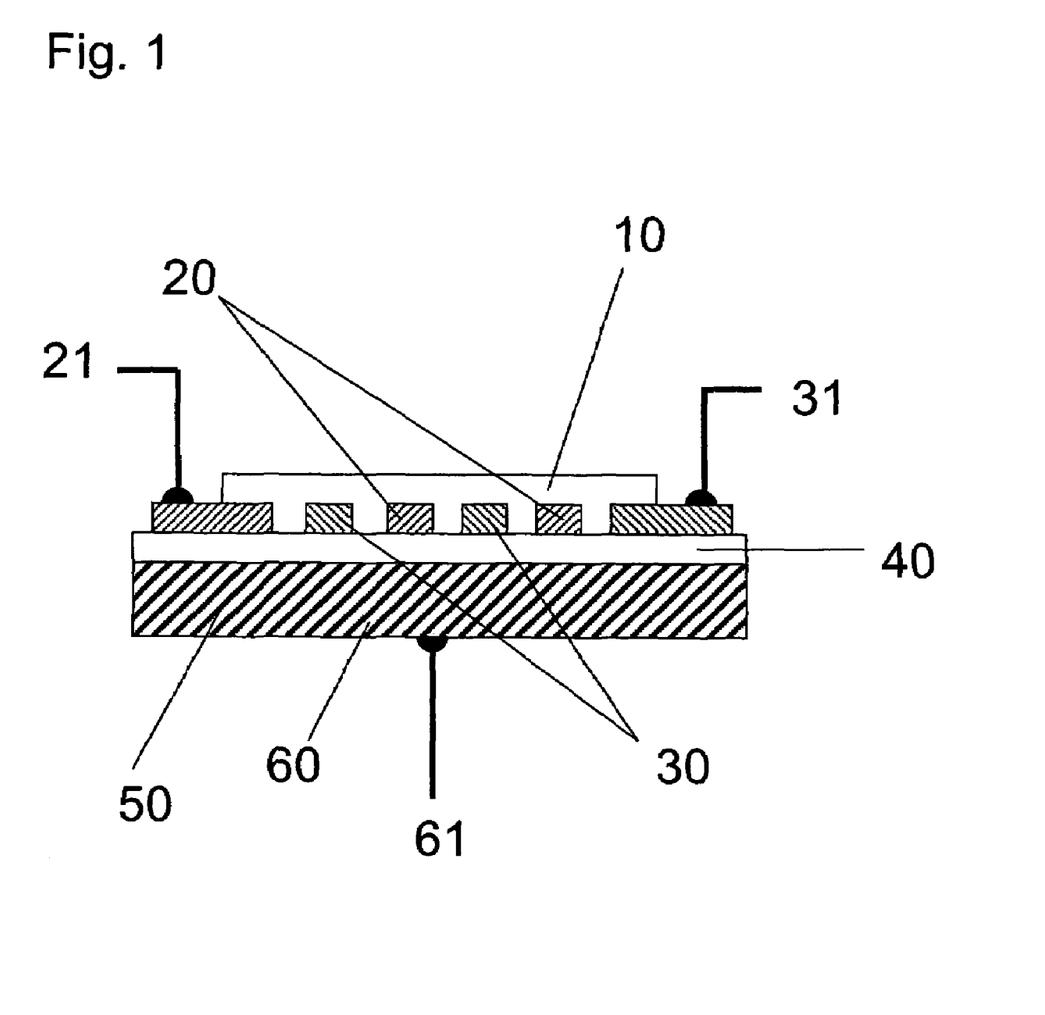
FIG. 1 is a schematic diagram of an organic thin film transistor device.

A thin film transistor (TFT), as shown in FIG. 1, was prepared through the following procedure. An n$^{++}$ silicon wafer 50 was used as a gate electrode substrate 60, and a SiO$_2$ film 40 formed on the wafer was used as a dielectric layer. In order to form a source electrode and a drain electrode on the SiO$_2$ film 40, a thin film of titanium was formed and, subsequently, a film of gold was formed by a sputtering method. Interdigital source electrode 30 and drain electrode 20 were patterned by a lithography method. The distance between the source electrode 30 and the drain electrode 20 was controlled at 20 μm, the electrode width was controlled at 500 mm. The organic semiconductor material solution prepared in Example 1 was placed on the above-described electrode substrate 60 and a thin film was formed by a spinner method, so that an organic semiconductor material layer 10 was formed on the electrodes. Lead wires 61, 31, and 21 were drawn out from the above-described gate electrode 60, the source electrode 30, and the drain electrode 20, respectively, so that a TFT device was prepared. With respect to the evaluation of the TFT characteristics, measurements were carried out with Picoammeter/Voltage Source produced by Hewlett-Packard. When the voltage between the source electrode and the drain electrode was controlled at 10 volts, and the gate voltage was controlled at plus 30, the current between the source electrode and the drain electrode was 100 nA. When the gate voltage was controlled at minus 30, the current between the source electrode and the drain electrode was 1,500 nA. That is, the current ratio was 15 when the gate voltage was changed from plus 30 to minus 30.

COMPARATIVE EXAMPLE 1

A TFT device was prepared in the same manner as that in Example 3 except that a poly-3-hexylthiophene solution containing no CNT was used as the coating solution for spinner coating, and the TFT characteristics were measured. In this case, the current between the source electrode and the drain electrode was 6 nA when the gate voltage was controlled at plus 30. When the gate voltage was changed to minus 30, the current between the source electrode and the drain electrode was 19 nA. Both values of the currents were low. The current ratio was also low, and was about 3.

COMPARATIVE EXAMPLE 2

In the case where a TFT device was prepared in the same manner as that in Example 3 except that the weight fraction of CNTs was changed from 1 percent by weight to 8 percent by weight, CNTs were brought into contact with each other, a short circuit occurred between the electrodes. Consequently, the functions of the TFT are not exerted, although the electrical conductivity is high.

EXAMPLE 4

Initially, 1 mg of SWCNTs (produced by Science Laboratories, purity 95 percent) were put in a 100 mL flask, 50 mL of chloroform was added, and dispersion was carried out with an ultrasonic cleaner for 1 hour. Subsequently, 1 g of conjugated polymer, poly-3-hexylthiophene (produced by Aldrich, molecular weight: Mw 20,000) was added, and dispersion was further carried out with an ultrasonic wave for 5 hours, so that an organic semiconductor material solution (ratio of CNTs to polymer of 0.1 percent by weight) was prepared. The above-described solution was applied to a glass substrate provided with opposite two interdigital electrodes (distance between electrodes: 20 μm) by the use of a spinner, so as to prepare a coating film. A voltage of 5 volts was applied between the interdigital electrodes while light irradiation was carried out with a white light source at an irradiation intensity of about 10 mW/cm$^2$, and the photocurrent was measured. The photocurrent was 330 μA at this time.

On the other hand, with respect to a coating film composed of poly-3-hexylthiophene alone, which contains no CNT, the photocurrent was measured under the same condition as that in the above description and, as a result, the photocurrent was 11 μA. That is, the photocurrent was increased in value by 30 times through the dispersion of 0.1 percent by weight of CNTs.

The photocurrent is a characteristic which incorporates the performance of a photovoltaic device and, therefore, it is expected that the performance of the photovoltaic device will be significantly improved through the dispersion of 0.1 percent by weight of CNTs.

Figure 3:
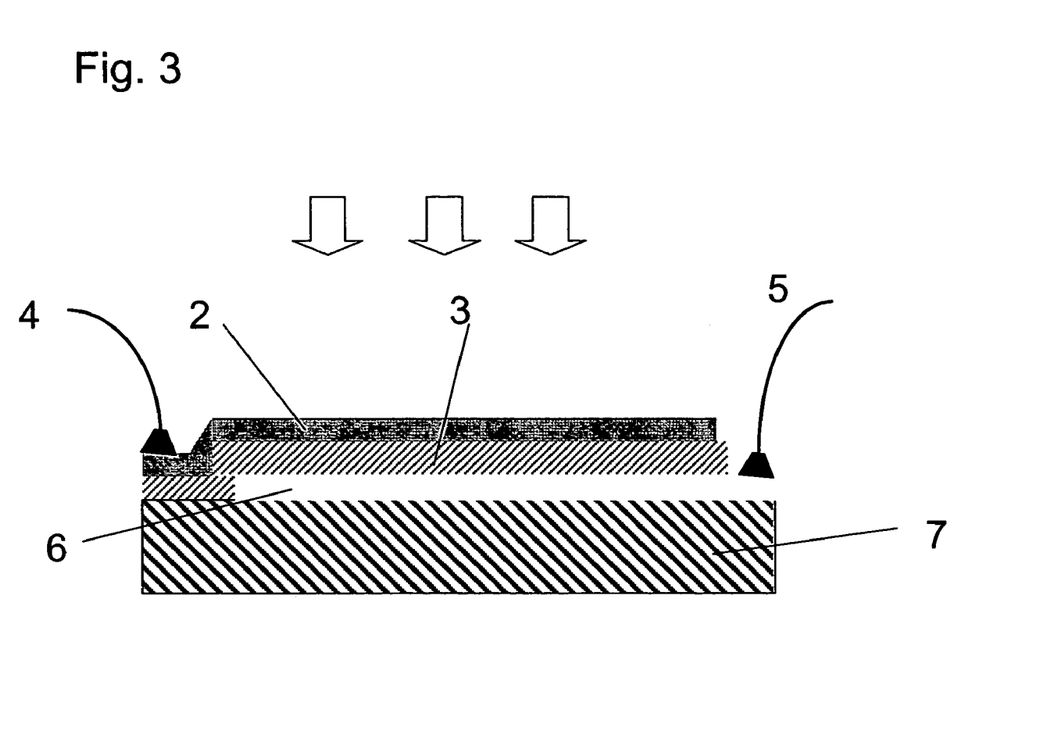
FIG. 3 is a schematic diagram of a photovoltaic device.

A method for preparing the photovoltaic device, as shown in FIG. 3, in which the above-described organic semiconductor material is used, will be described. An indium oxide layer 6 of 100 nm in thickness, which is in the shape of stripes of 3 mm×30 mm and serves as a first electrode having a light transmission property, is formed on a glass substrate 7 by a sputtering method through the use of a mask. The above-described organic semiconductor material solution is applied to this substrate by the use of a spinner, so as to form a coating film 3 of 0.2 μm in thickness. An aluminum layer 2 of 40 nm in thickness, which is in the shape of stripes of 3 mm×30 mm and serves as a second electrode, is formed on the resulting coating film by a sputtering method. At this time, the aluminum layer is formed while a mask orthogonal to the indium oxide layer is disposed. Lead wires 4 and 5 are drawn out from these upper and lower electrodes so as to prepare a photoelectric conversion device.

The voltage-current characteristic is measured with Picoammeter/Voltage Source produced by Hewlett-Packard while incident light 1 is applied from the indium oxide layer side of the resulting photoelectric conversion device. It is predicted that the short-circuit current will be about 4

μA/cm², and the open-circuit voltage will be about 0.5 V when a white light source for a microscope is used, and light is applied at an irradiation intensity of 10 mW/cm².

It is predicted that the short-circuit current under light irradiation will be about 30 nA/cm², and the open-circuit voltage will be about 0.3 V when no CNT is dispersed in poly-3-hexylthiophene. The short-circuit current under light irradiation is increased in value by at least 100 times through the dispersion of CNTs.

It is predicted that the short-circuit current will be about 9 μA/cm², and the open-circuit voltage will be 0.4 V when poly(2-methoxy-5-(3',7'-dimethyloctyloxy)-p-phenylenevinylene) (produced by Aldrich) is used in place of poly-3-hexylthiophene.

Figure 4:
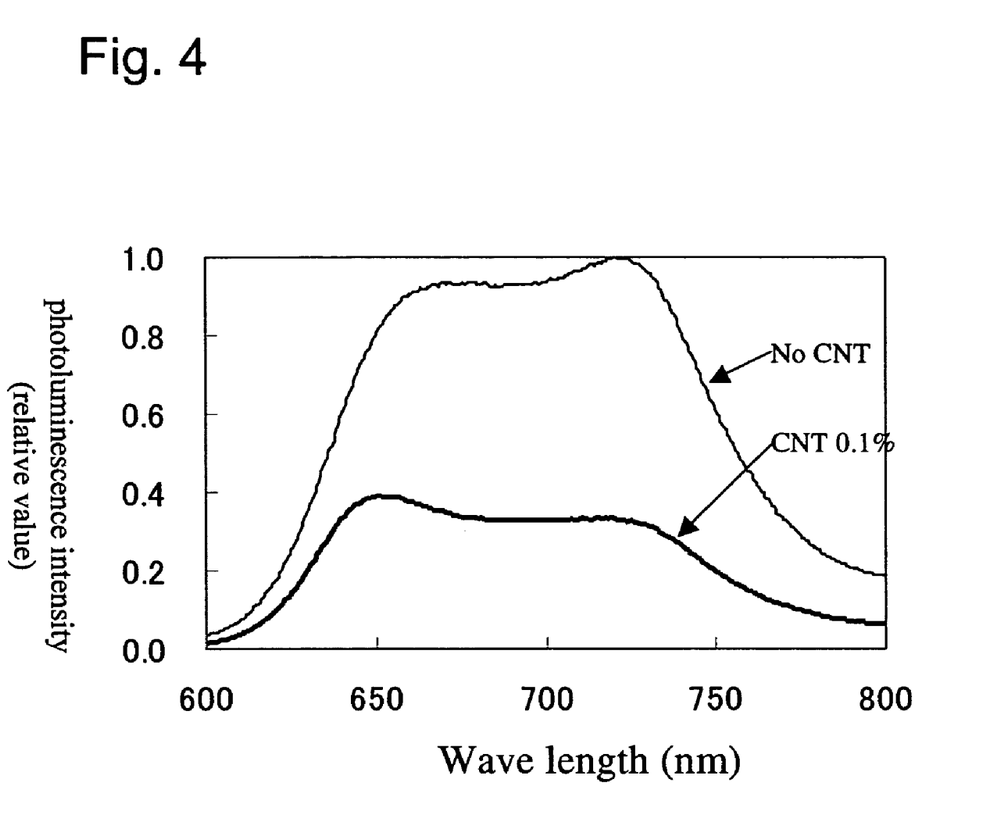
FIG. 4 shows photoluminescence spectra of organic semiconductor materials.

The evaluation of the photoluminescence intensity of the above-described organic semiconductor material was carried out as described below. The organic semiconductor material solution was dropped onto a glass substrate, and a thin film of 720 nm in thickness was formed by the use of a spinner. For purposes of comparison, a thin film composed of poly-3-hexylthiophene alone, which contains no CNT, was prepared on a glass substrate in a similar manner. These thin films were irradiated with excitation light of 450 nm, and photoluminescence spectra were measured. The results are shown in FIG. 4. As is clear from FIG. 4, the photoluminescence intensity in the case where 0.1 percent by weight of CNTs are contained is 50 percent or less of that in the case where no CNT is contained. In this manner, it is indicated that electrons and holes generated by the excitation light are separated efficiently and an electromotive force is generated effectively.

EXAMPLE 5

A solution was prepared in the same manner as that in Example 4 except that the ratio of SWCNTs was 1 percent by weight, and the photoluminescence intensity was measured. As a result, the photoluminescence intensity was 16 percent or less of that in the case where no CNT is contained. In this manner, it is indicated that electrons and holes generated by the excitation light are separated efficiently and an electromotive force is generated effectively.

INDUSTRIAL APPLICABILITY

According to the present invention, an organic semiconductor material having a high carrier mobility can be supplied industrially. Furthermore, a high-performance organic semiconductor device can be attained by the use of the organic semiconductor material of the present invention.

The invention claimed is:

1. An organic semiconductor material comprising carbon nanotubes and a conjugated polymer,
    wherein the carbon nanotubes are dispersed in the conjugated polymer,
    the weight fraction of the carbon nanotubes is 3 percent or less relative to the conjugated polymer, and
    the conjugated polymer comprises a straight-chain conjugated polymer.

2. The organic semiconductor material according to claim 1, wherein the weight fraction of the carbon nanotubes is from 0.1 percent to 3 percent relative to the conjugated polymer.

3. The organic semiconductor material according to claim 1, wherein the conjugated polymer comprises at least one selected from the group consisting of polythiophene-based polymers, polyphenylenevinylene-based polymers, and polythienylenevinylene-based polymers.

4. The organic semiconductor material according to claim 1, wherein the carbon nanotube is a single-walled carbon nanotube.

5. The organic semiconductor material according to claim 1, wherein the mobility of the organic semiconductor material is at least $10^{-3}$ cm²/V·sec.

6. An organic semiconductor device including the organic semiconductor material according to claim 1.

7. The organic semiconductor device according to claim 6, wherein the organic semiconductor device is an organic thin film transistor device.

8. The organic semiconductor device according to claim 6, wherein the organic semiconductor device is an organic photovoltaic device.

* * * * *